May 21, 1968 B. F. GREGORY 3,384,836

TRANSISTOR MICROWAVE OSCILLATOR HAVING
SECOND HARMONIC OUTPUT

Filed April 10, 1967

INVENTOR.
Benjamin F. Gregory

BY

Blair, Buckles, Cesari & St. Onge
ATTORNEYS.

3,384,836

TRANSISTOR MICROWAVE OSCILLATOR HAVING SECOND HARMONIC OUTPUT

Benjamin F. Gregory, Tampa, Fla., assignor to Trak Microwave Corporation, Tampa, Fla.

Filed Apr. 10, 1967, Ser. No. 630,179
4 Claims. (Cl. 331—117)

ABSTRACT OF THE DISCLOSURE

This application discloses a solid-state microwave radio frequency oscillator employing a matched pair of transistors having their base terminals connected back-to-back across a tuned oscillatory tank circuit in a manner to produce push-push oscillatory action. The disclosed circuit takes radio frequency power at the second harmonic of the oscillatory frequency from a center tap on the oscillatory tank circuit. The fundamental frequency, and all odd harmonics thereof, are cancelled out, while the second harmonic is accentuated. By this means substantial amounts of microwave energy are produced at a frequency twice that at which the transistors are forced to oscillate, thus creating a solid state oscillator capable of operation at twice the upper frequency limit heretofore imposed by the inherent characteristics of transistors. Also disclosed is a transistor operated current control circuit for turning the frequency output of the oscillator, and thereby enabling the oscillator output signal to be frequency modulated.

BACKGROUND OF THE INVENTION

One of the serious limitations upon the use of solid-state devices such as transistors for generation of microwave radio frequency energy has been the limited upper range of frequencies at which such devices can be made to sustain oscillatory action. This absolute upper limit has been determined by the inherent and unavoidable interelectrode capacity within the transistor itself. While significant improvements in transistor design and manufacture have in some cases reduced this interelectrode capacity, enabling modern transistors to be "pushed" to higher frequencies than were obtainable a few years ago, nevertheless there is in the present state of the art an irreducible minimum of such capacitance which imposes an absolute maximum of frequency at which such devices may be employed as sources of oscillatory energy. And all such devices are known to be more efficient and more stable oscillators when operated at frequencies below their maximum frequency capability. The present invention, therefore, enables any type of transistor to be employed most efficiently as a source of microwave energy, in the high gigacycle range, without requiring the transistor itself to sustain such a high fundamental frequency. The oscillator of the invention is also capable of being frequency modulated by the addition of a single transistor and simple resistance network.

One of the objects of the invention is to provide a simple, compact and inexpensive source for the efficient generation of radio frequency energy in the upper microwave range.

Another object is to provide means for increasing the upper frequency range at which transistors may be usefully employed to produce microwave oscillations.

A further object is to provide such a solid-state microwave source with means for electronic tuning or frequency modulation.

Other objects of the invention will in part be obvious and will in part appear hereinafter.

The invention accordingly comprises the features of construction, combination of elements, the arrangement of parts which will be exemplified in the construction hereinafter set forth, and the scope of the invention will be indicated in the claims.

Figure 1:
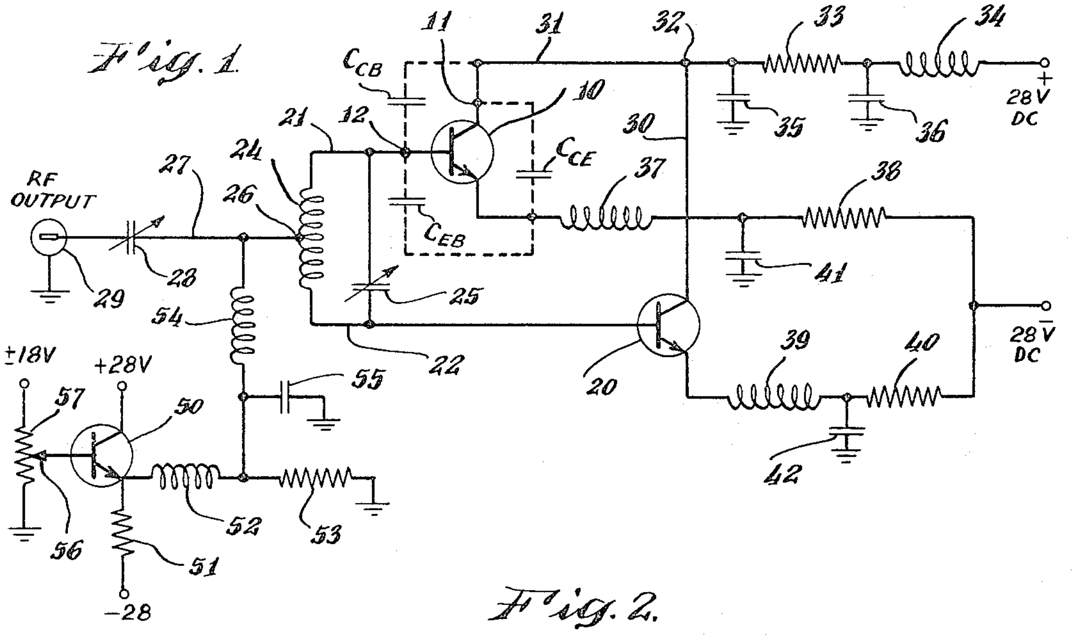
Figure 2:
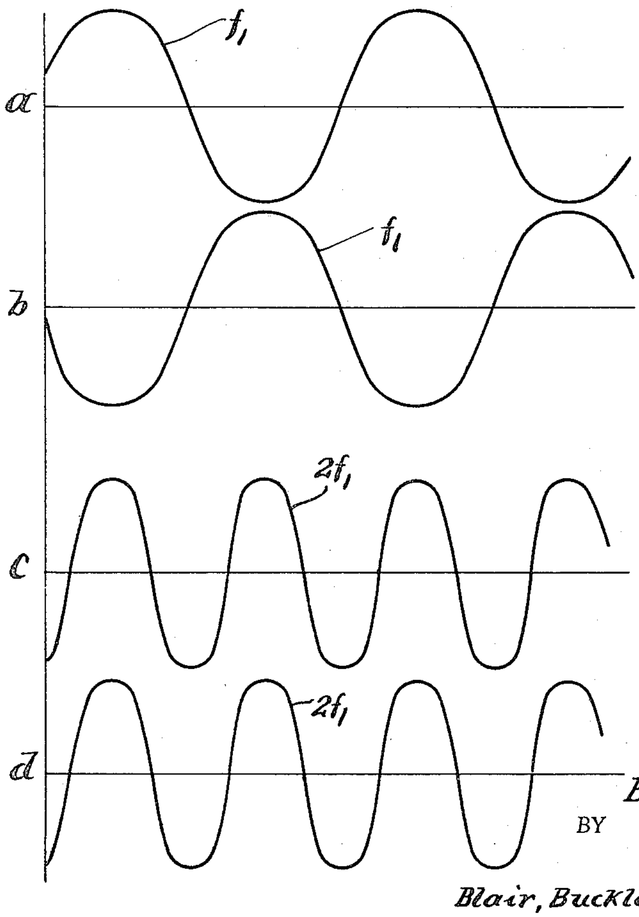
Figure 3:
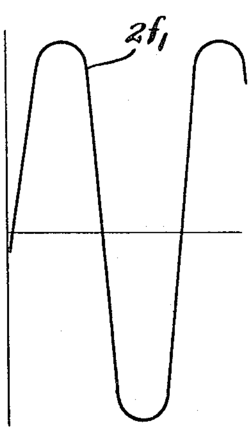

For a fuller understanding of the nature and objects of the invention, reference should be had to the following detailed description taken in connection with the accompanying drawings, in which:

FIGURE 1 is a schematic circuit diagram of the oscillator of the invention, including preferred means for electronic tuning and/or frequency modulation thereof;

FIGURE 2*a* and 2*b* is a diagrammatic representation of the fundamental oscillatory waves generated by each of the oscillator transistors in the circuit of FIGURE 1; while FIGURE 2*c* and 2*d* is a diagrammatic representation of the second harmonics of each transistor's oscillatory waves; and FIGURE 3 is a diagrammatic repreesntation of the combined second harmonics of both transistors, showing how they add to produce a signal of the same frequency but twice the amplitude shown in FIGURES 2*c* and 2*d*.

DETAILED DESCRIPTION

Referring now in greater detail to FIGURE 1 of the drawing, the oscillator of the invention comprises a first transistor 10 having a collector terminal 11, a base terminal 12 and an emitter terminal 13. The inherent interelectrode capacitances within the transistor 10 are shown by broken lines in FIGURE 1 as: $C_{CB}$ which represents the collector-to-base capacitance, $C_{EB}$ which represents the emitter-to-base capacitance, and $C_{CE}$ which represents the collector-to-emitter capacitance. A second transistor, 20, has identical interelectrode capacitances (not shown). The base terminals of transistors 10 and 20 are respectively connected by lines 21 and 22 to the opposite ends of a tuned tank circuit comprising an inductance 24 and a variable tuning condenser 25. The inductance 24 is provided with a center-tap 26 at its exact midpoint, which is connected via a conductor line 27 through an adjustable coupling capacitor 28 to a radio frequency output terminal 29. The collector terminals of transistors 10 and 20 are connected together by conductors 30 and 31, of equal length, to a junction point 32, which is in turn connected through a fixed resistor 33 and a radio frequency choke 34 to a source of +28 volts DC power. Bypass capacitors 35 and 36 are respectively connected between opposite ends of resistor 33 and ground, as shown. The emitter terminal 13 of transistor 10 is connected through a radio frequency choke 37 and a fixed resistor 38 to a source of —28 volts DC power, while the emitter terminal of transistor 20 is similarly connected through a radio frequency choke 39 and a fixed resistor 40 to the same source of —28 volts. Bypass capacitors 41 and 42 are respectively connected from the junctions of choke 37 and resistor 38, and choke 39—resistor 40 to ground, as shown.

The circuit of FIGURE 1 as thus far described enables the transistors 10 and 20 to oscillate at a common frequency, but 180 degrees out of phase with each other. The frequency of such oscillations is determined by the inductance 24 and capacitance 25 of the tuned tank circuit and, since the oscillations of each transistor 10 and 20 are phased at 180 degrees apart, the total oscillatory power imparted to the tank circuit 24—25 is twice the power produced by either transistor acting alone. However, because the radio frequency output is taken from the midpoint 26 of tank inductance 24, the voltage of the fundamental frequency signal at this point is always zero, the equal and opposite phased signals in both halves of the tank circuit cancelling each other as shown in FIGURES 2*a* and *b*. All odd harmonics of the fundamental frequency are similarly cancelled out.

However, the circuit of FIGURE 1 efficiently utilizes the inherent characteristic of non-linearity in the collector-to-lose internal capacity, $C_{CB}$, of both transistor oscillators 10 and 20, which characteristic causes the transistors to generate very strong second harmonics of the frequency at which they oscillate. Since these second harmonics, at twice the fundamental frequency, are in phase with each other, as shown in FIGURES 2*c* and 2*d*, their voltages are additive as shown in FIGURE 3, and are at a maximum value at the midpoint center tap 26 of tank inductance 24. Thus the radio frequency output signal on conductor 27 comprises the sum of the second harmonic signals generated by transistors 10 and 20, and is twice the value of such signal as generated by either transistor alone.

Referring again to FIGURE 1 of the drawing, the means for electronically tuning the output frequency of the microwave oscillator of the invention will be described. A transistor 50 has its collector terminal connected to a source of +28 volts DC power, and its emitter terminal connected through a fixed bias resistor 51 to −28 volts. The source of power for both of these connections may be the same source of ±28 volts connected respectively to radio frequency choke 34 and resistor 40 in FIGURE 1. The emitter of transistor 50 is also connected through a radio frequency choke 52 and fixed resistor 53 to ground. The junction between radio frequency choke 52 and resistor 53 is connected through another radio frequency choke 54 to the oscillator output signal line 27, and is bypassed to ground through a fixed bypass capacitor 55. The base terminal of transistor 50 is connected to the adjustable slide 56 of potentiometer 57, the opposite ends of which are connected respectively to ground, and to a source of plus or minus 18 volts tuning voltage. Thus, when a modulation signal swinging between +18 volts, or any value therebetween, is applied across potentiometer 57, the corresponding variations in emitter current of transistor 50 are applied to the output oscillator signal on line 27, thereby changing the frequency of the oscillator output and producing frequency modulation thereof. In this manner the output signal of the oscillator of FIGURE 1 may be electronically tuned, and the device of the invention may thereby be operated as a frequency modulated microwave oscillator.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Having described my invention, which I claim as new and desire to secure by Letters Patent is:

1. A solid-state microwave oscillator comprising in combination:

(a) first and second transistors each having base, collector and emitter electrodes, (b) a unitary tuned tank circuit comprising parallel inductance and capacitance, (c) means connecting the base electrodes of each of said transistors to opposite terminals of said tuned tank circuit, (d) means connecting the collector electrodes of each of said transistors to a source of positive direct current potential, (e) means connecting the emitter electrodes of each of said transistors to a source of negative direct current potential, and (f) a radio frequency output conductor connected to a center tap on said inductance at a point midway between opposite terminals of said tuned tank circuit.

2. The combination of claim 1 including electronic tuning means comprising:

(a) a third transistor having base, collector and emitter electrodes, (b) means connecting the collector electrode of said third transistor to a source of positive direct current potential, (c) means connecting the emitter electrode of said third transistor to a source of negative direct current potential, (d) further means including a radio frequency choke connecting the emitter electrode of said third transistor to said radio frequency output conductor, and (e) means for applying a variable voltage to the base electrode of said third transistor.

3. The improvement in solid-state sources of microwave energy comprising:

(a) a pair of substantially identical transistors each having collector, emitter and base terminals, and having their base terminals respectively connected to opposite ends of a parallel tuned oscillatory circuit, (1) said oscillatory circuit comprising a fixed inductor having a center-tap, and a variable capacitor connected across opposite ends of said inductor, (b) means including a radio frequency choke in series with a fixed resistance connecting the collector terminals of both of said transistors to a common source of positive direct current potential, (c) means including a pair of radio frequency chokes each in series with a fixed resistance and each connecting the emitter electerodes of said transistors to a common source of negative direct current potential, and (d) a radio frequency output conductor coupled to said fixed inductor center-tap.

4. The combination of claim 3 and frequency modulation means comprising in combination:

(a) a third transistor having collector, emitter and base terminals, (b) a power supply connected to apply a fixed positive potential to the collector and a fixed negative bias to the emitter of said third transistor, (c) means for applying a modulated variable voltage to the base terminal of said third transistor, and (d) means including a radio frequency choke connected between the emitter terminal of said third transistor and said radio frequency output conductor.

No references cited.

ROY LAKE, *Primary Examiner.*

S. H. GRIMM, *Assistant Examiner.*